United States Patent

Henley et al.

[11] Patent Number: 6,033,974
[45] Date of Patent: Mar. 7, 2000

[54] METHOD FOR CONTROLLED CLEAVING PROCESS

[75] Inventors: Francois J. Henley, Los Gatos; Nathan W. Cheung, Albany, both of Calif.

[73] Assignee: Silicon Genesis Corporation, Campbell, Calif.

[21] Appl. No.: 09/370,975

[22] Filed: Aug. 10, 1999

Related U.S. Application Data

[63] Continuation-in-part of application No. 09/313,959, May 18, 1999, which is a continuation-in-part of application No. 09/026,027, Feb. 19, 1998
[60] Provisional application No. 60/046,276, May 12, 1997.
[51] Int. Cl.[7] .............................. H01L 21/22; H01L 21/38
[52] U.S. Cl. ........................ 438/526; 438/510; 438/800
[58] Field of Search ..................................... 438/515, 526, 438/510, 690, 800

[56] References Cited

U.S. PATENT DOCUMENTS 5,374,564 12/1994 Bruel ........................................ 438/510

*Primary Examiner*—Charles Bowers
*Assistant Examiner*—Craig Thompson
*Attorney, Agent, or Firm*—Townsend and Townsend and Crew LLP

[57] ABSTRACT

A technique for forming a film of material (12) from a donor substrate (10). The technique has a step of forming a stressed region in a selected manner at a selected depth (20) underneath the surface. An energy source such as pressurized fluid is directed to a selected region of the donor substrate to initiate a controlled cleaving action of the substrate (10) at the selected depth (20), whereupon the cleaving action provides an expanding cleave front to free the donor material from a remaining portion of the donor substrate.

20 Claims, 8 Drawing Sheets

METHOD FOR CONTROLLED CLEAVING PROCESS

CROSS-REFERENCES TO RELATED APPLICATIONS

This is a continuation-in part-of U.S. application Ser. No. 09/313,959, filed May 18, 1999 pending, which is a continuation-in-part of and claims priority from U.S., application Ser. No. 09/026,027, filed Feb. 19, 1998 allowed, which claims the benefit of U.S. Provisional application No. 60/046,276, filed May 12, 1997, commonly owned and hereby incorporated by reference for all purposes.

BACKGROUND OF THE INVENTION

The present invention relates to the manufacture of substrates. More particularly, the invention provides a technique including a method and device for cleaving a substrate in the fabrication of a silicon-on-insulator substrate for semiconductor integrated circuits using a pressurized fluid, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Craftsmen or more properly crafts-people have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures such as a glass plate, a diamond, a semiconductor substrate, and others.

These substrate structures are often cleaved or separated using a variety of techniques. In some cases, the substrates can be cleaved using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and/or brittle materials such as diamond or glass.

Accordingly, techniques have been developed to separate these hard and/or brittle materials using cleaving approaches. In diamond cutting, for example, an intense directional thermal/mechanical impulse is directed preferentially along a crystallographic plane of a diamond material. This thermal/mechanical impulse generally causes a cleave front to propagate along major crystallographic planes, where cleaving occurs when an energy level from the thermal/mechanical impulse exceeds the fracture energy level along the chosen crystallographic plane.

In glass cutting, a scribe line using a tool is often impressed in a preferred direction on the glass material, which is generally amorphous in character. The scribe line causes a higher stress area surrounding the amorphous glass material. Mechanical force is placed on each side of the scribe line, which increases stress along the scribe line until the glass material fractures, preferably along the scribe line. This fracture completes the cleaving process of the glass, which can be used in a variety of applications including households.

Although the techniques described above are satisfactory, for the most part, as applied to cutting diamonds or household glass, they have severe limitations in the fabrication of small complex structures or precision workpieces. For instance, the above techniques are often "rough" and cannot be used with great precision in fabrication of small and delicate machine tools, electronic devices, or the like. Additionally, the above techniques may be useful for separating one large plane of glass from another, but are often ineffective for splitting off, shaving, or stripping a thin film of material from a larger substrate. Furthermore, the above techniques may often cause more than one cleave front, which join along slightly different planes, which is highly undesirable for precision cutting applications. Other processing techniques such as the use of a release layer have also had limited success. Such release layer techniques often require wet chemical etching, which is often undesirable in many state of art applications.

From the above, it is seen that a technique for separating a thin film of material from a substrate which is cost effective and efficient is often desirable.

SUMMARY OF THE INVENTION

According to the present invention, an improved technique for removing a thin film of material from a substrate using a controlled cleaving action is provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, the present invention provides a process for forming a film of material from substrates. The process includes providing a bulk substrate (e.g., silicon) comprising an upper surface. The process also includes forming a compressive layer (e.g., silicon germanium) overlying the upper surface. The method also includes forming a material layer (e.g., epitaxial silicon) overlying the compressive layer. Energy is provided using a fluid to a selected region of the compressive layer to initiate and maintain a controlled cleaving action at the compressive layer, whereupon the cleaving action is made using a propagating cleave front to free the material layer from the bulk substrate. Preferably, the bulk substrate structure is bonded to a handle wafer, where the device layer overlies the handle wafer, before the energy is provided.

In an alternative embodiment, the present invention provides a process for forming a film of material from substrates. The process includes providing a bulk substrate (e.g., silicon) comprising an upper surface. The process also includes forming a cleaving layer overlying the upper surface. The process also includes forming a material layer (e.g., epitaxial silicon) overlying the cleaving layer. Next, particles (e.g., hydrogen, helium, deuterium, or any other light atomic mass particles and the like) are introduced into the cleaving layer. These particles enhance the present cleaving action, which is described below. Energy is provided using a fluid to a selected region of the cleaving layer to initiate and maintain a controlled cleaving action at the cleaving layer, whereupon the cleaving action is made using a propagating cleave front to free the material layer from the bulk substrate. In a specific embodiment, cleaving occurs at or within the cleaving layer.

In most of the embodiments, a cleave is initiated by subjecting the material with sufficient energy to fracture the material in one region or more, causing a cleave front, without uncontrolled shattering or cracking. The cleave front formation energy ($E_c$) must often be made lower than the bulk material fracture energy ($E_{mat}$) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy ($E_p$). The relationship can be expressed as:

$$E_c = E_p + [\text{cleave front stress energy}]$$

A controlled cleaving process is realized by reducing $E_p$ along a favored direction(s) above all others and limiting the available energy to be below the $E_p$ of other undesired directions. In any cleave process, a better cleave surface finish occurs when the cleave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor substrate, or multi-material films according to other embodiments. In most cases, the controlled cleaving process can occur at, for example, room temperature, as well as others. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, the present invention reduces damage caused by higher than necessary stress or pressure effects and nucleation sites caused by the energetic particles as compared to pre-existing techniques. Depending upon the embodiment, one or more of these advantages, as well as others, may exist.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

The present invention provides a technique for removing a thin film of material from a substrate while preventing a possibility of damage to the thin material film and/or a remaining portion of the substrate. The thin film of material is attached to or can be attached to a target substrate to form, for example, a silicon-on-insulator wafer. The thin film of material can also be used for a variety of other applications. The invention will be better understood by reference to the Figs. and the descriptions below.

Figure 1:
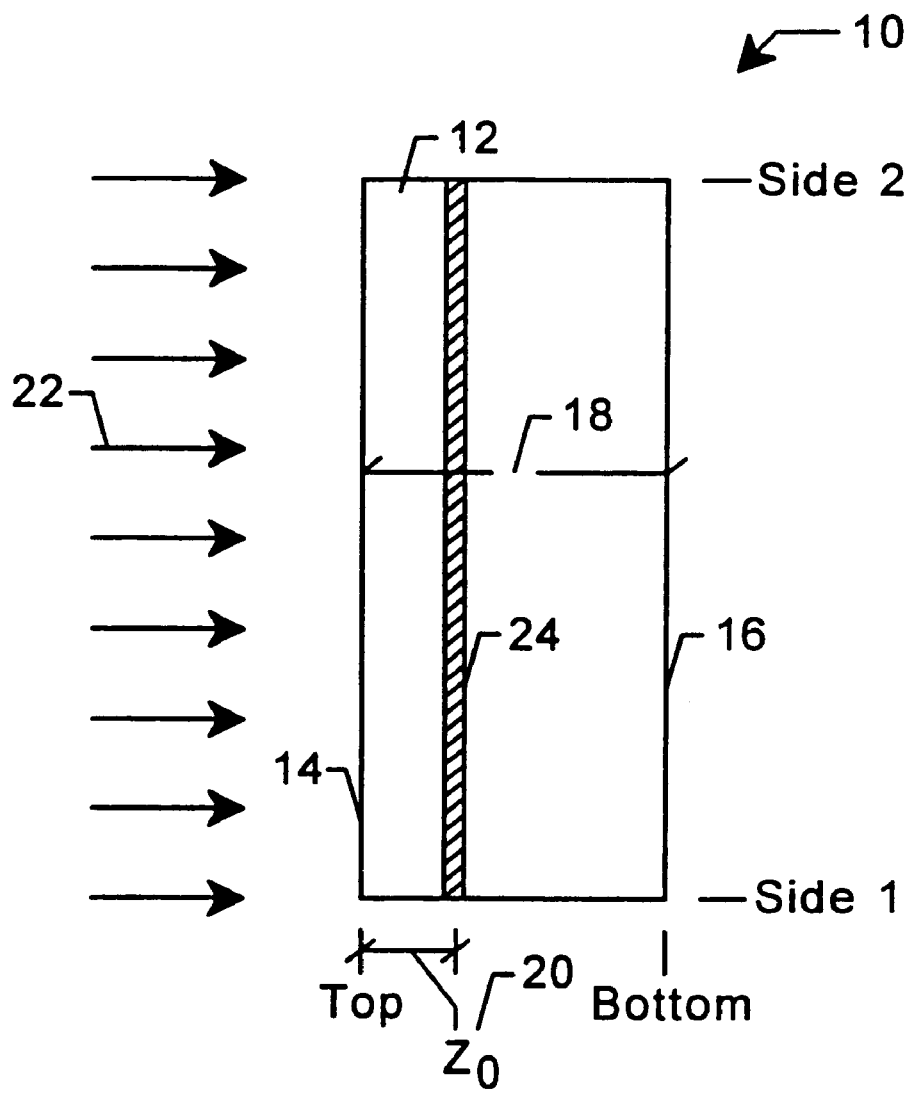
FIGS. 1, 1A–1C, 2–6, 6A–6C, and 7–11 are simplified diagrams illustrating a controlled cleaving technique according to embodiments of the present invention.

FIG. 1 is a simplified cross-sectional view diagram of a substrate 10 according to the present invention. The diagram is merely an illustration and should not limit the scope of the claims herein. As merely an example, substrate 10 is a silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the silicon wafer. The present invention provides a novel technique for removing the material region 12 using the following sequence of steps.

In a specific embodiment, selected energetic particles implant 22 through the top surface 14 of the silicon wafer to a selected depth 24, which defines the thickness 20 of the material region 12, termed the thin film of material. A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion implantation techniques are described in "Recent Applications of Plasma Immersion Ion Implantation," Paul K. Chu, Chung Chan, and Nathan W. Cheung, SEMICONDUCTOR INTERNATIONAL, pp. 165–172, June 1996, and "Plasma Immersion Ion Implantation—A Fledgling Technique for Semiconductor Processing,", P. K. Chu, S. Qin, C. Chan, N. W. Cheung, and L. A. Larson, MATERIAL SCIENCE AND ENGINEERING REPORTS, A Review Journal, pp. 207–280, Volume R17, Nos. 6–7, (Nov. 30, 1996), which are both hereby incorporated by reference for all purposes. Furthermore, implantation can occur using ion shower. Of course, techniques used depend upon the application.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes (i.e., deuterium), rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{15}$ atoms/cm$^2$. Implantation energy ranges from about 1 KeV to about 1 MeV, and is generally about 50 KeV. Implantation temperature ranges from about −200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

In an alternative embodiment, chemical, amorphization, interstitial, and or other stress can be introduced by adding heavier particles to the cleaving layer. Here, the heavier particles include one or any combination of silicon, oxygen, germnanium, carbon, nitrogen, or any other suitable heavier particle that can add stress and enhance cleaving. These heavier particles can be implanted through the device layer or can be diffused or the like. In a specific embodiment, a dose requirement for these heavier particles would generally be less than that of lighter particles. A combination of heavier and lighter particles can also be used in other embodiments. Depending upon the application, many other ways of introducing stress can also be used.

Effectively, the implanted particles add stress or reduce fracture energy along a region parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can be repaired by subsequent heat treatment, e.g., thermal annealing or rapid thermal annealing.

Figure 1A:
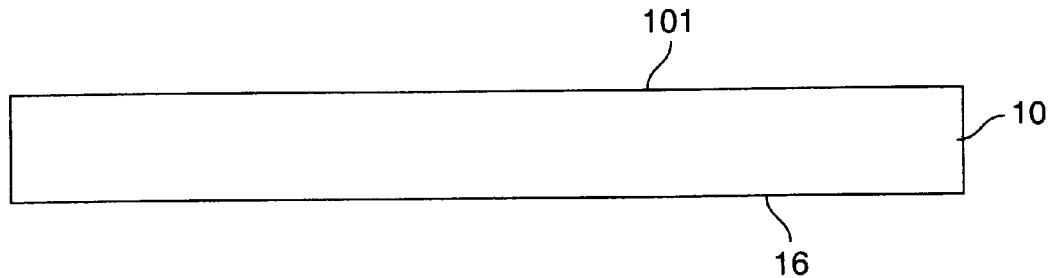
Figure 1B:
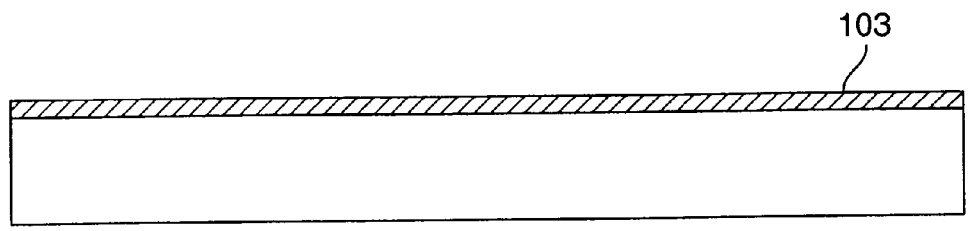
Figure 1C:
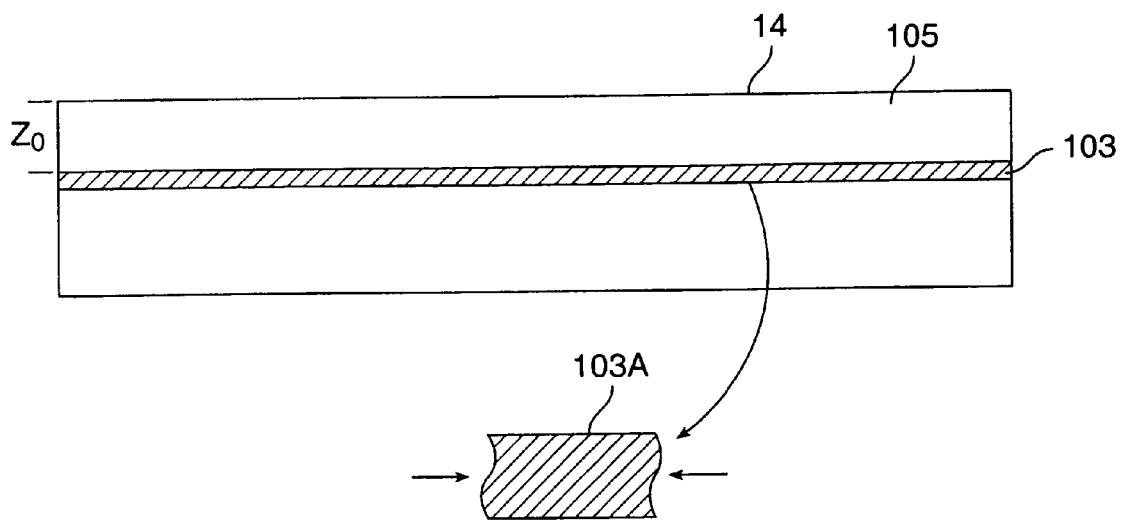

FIGS. 1A to 1C are simplified diagrams of an alternative process for forming a stressed region, which is used to cleave a film of material from a substrate. These diagrams are merely examples, which should not limit the scope of the claims herein. One of ordinary skill in the art would recognize many other variations, alternatives, and modifications. Like reference numerals are used in these diagrams as others noted here, but are not intended to be limiting. As merely an example, substrate 10 is a silicon wafer. The silicon wafer 10 includes a top surface 101 and a bottom surface 16. Substrate 10 also has a first side (side 1) and a second side (side 2). A stressed layer is formed overlying the top surface of substrate 10.

The stressed layer can be formed by a variety of techniques. The stressed layer can be formed using chemical vapor deposition, physical vapor deposition, molecular beam epitaxy ("MBE"), plating, and other techniques, which include any combination of these. The stressed layer is preferably a silicon alloy, such as silicon germanium or silicon germanium carbon. The silicon germanium carbon layer has a stoichiometry of $Si_xGe_yC_z$ where x, y, and z are selectively adjusted during deposition. Adjustment can occur by changing flow rates of respective mass flow controllers. The ratio of silicon to germanium to carbon is selectively adjusted to provide a desired cleaving action according to the present invention. The stressed layer can also be a doped or undoped epitaxial silicon layer. The epitaxial silicon layer is made using an epitaxial reactor. An example of such a reactor is an epi-Centura™ reactor made by Applied Materials, Inc. of Santa Clara, Calif. Other reactors such as those made by ASM and other companies can also be used. Other materials can also be used. Optionally, the stressed layer is a multiple layered structure 103A according to an embodiment of the present invention. The multiple or multilayered structure can include a combination of compressional layers and tensile layers. The present multiple layered structure can be formed by distinct layers or graded layers, depending upon the application. In other embodiments, one or each of these layers can also be doped using in-situ deposition techniques and/or implantation techniques, as will be discussed below. Here, particles arc implanted into the stressed layer. Implantation can include introducing particles or impurities such as hydrogen, helium, nitrogen, boron, and other species, which selectively provides a tensile or compressive additive characteristic to the layer. Other techniques such as in-situ doping and/or diffusion of impurities can also be used to introduce impurities into any one of the layers.

Overlying the stressed layer is a material layer 105, which can be formed by a variety of techniques. In a specific embodiment, the material layer is a layer where the device or devices are formed thereon. The material layer is a high quality layer of silicon for example. The material layer can be deposited using chemical vapor deposition, MBE, physical vapor deposition, plating, and other techniques, which include any combination of these. In a preferred embodiment, the material layer is a crystalline silicon layer or epitaxial silicon layer. The epitaxial silicon layer is made by depositing epitaxial silicon that may be doped using one or more dopants. These dopants include among others, boron, phosphorous, arsenic, and oxygen or any combination thereof. The material layer has an upper surface 14, which is the same reference number noted above.

Figure 2:
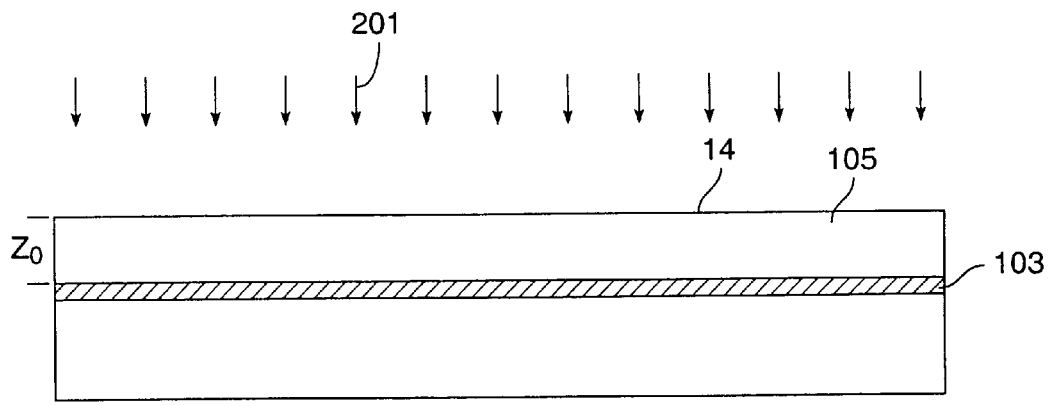
Figure 3:
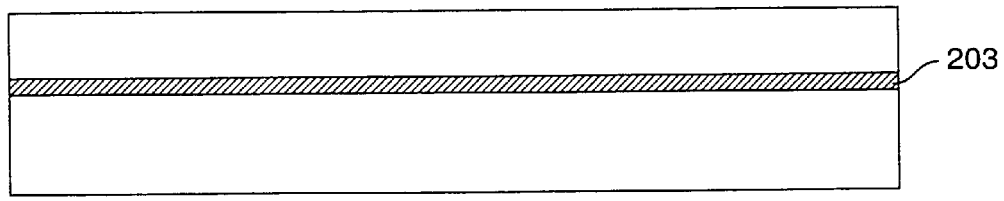

In some embodiments, particles are introduced through upper surface 14 into the stressed layer 103, as shown in a simplified diagram of FIG. 2. This diagram is merely an example which should not limit the scope of the claims herein. For example, surface 14 could be oxidized by a (try or wet oxidation process prior to or after implantation to incorporate an oxide layer in the material region 105. One of ordinary skill in the art would recognize many other variations, modifications, and alternatives. Here, particles 201 are implanted through surface 14 to the stressed layer 103 to form a combination of stressed and implanted layer 203, as shown in FIG. 3. Depending upon the application, smaller mass particles are generally selected to reduce a possibility of damage to the material region 105. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes (i.e., deuterium), rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{15}$ atoms/cm$^2$. Implantation energy ranges from about 1 KeV to about 1 MeV, and is generally about 50 KeV. Implantation temperature ranges from about −200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

In an alternative embodiment, chemical, amorphization, interstitial, and or other stress can be introduced by adding heavier particles to the cleaving layer. Here, the heavier particles include one or any combination of silicon, oxygen, germanium, carbon, nitrogen, or any other suitable heavier particle that can add stress and enhance cleaving. These heavier particles can be implanted through the device layer or can be diffused or the like. In a specific embodiment, a dose requirement for these heavier particles would generally be less than that of lighter particles. A combination of heavier and lighter particles can also be used in other embodiments. Depending upon the application, many other ways of introducing stress can also be used.

Effectively, the implanted particles add additional stress or reduce fracture energy along a region parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can be repaired by subsequent heat treatment, e.g., thermal annealing or rapid thermal annealing.

Figure 4:
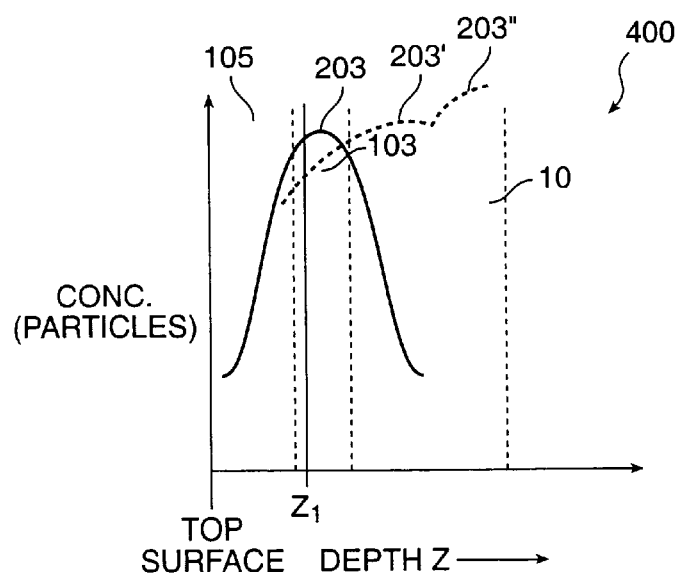

Preferably, the particles are implanted in a selected manner to provide a profile distribution 400 as shown in the simplified diagram of FIG. 4. This diagram is merely an illustration, which should not unduly limit the scope of the claims herein. One of ordinary skill in the art would recognize many other variations, modifications, and alternatives. The diagram illustrates concentration of particles on the vertical axis, which is plotted against depth from the top surface of the material layer 105. The depth increases through the material layer 105, through the stressed layer 103, and through the substrate 10. The implant profile includes a maximum region 203, which may or may not be along a center region of the stressed layer. The stressed region preferably cleaves along a region away from the maximum region 203 according to the present invention. The stressed region cleaves at, for example, $z_1$, which is away from the maximum region. In the following discussion, the material layer is removed or cleaved from the stressed layer using a controlled cleaving action. The material layer can also be formed using an in-situ doping process, which can be homogeneous or graded, depending upon the application. Depending upon the application, many implant distributions may exist. For example, the implant distribution can have a single maximum, where the maximum is symmetrical or offset to one side or the other side. Alternatively, the distribution can be shaped like a pulse. Alternatively, the distribution can be a combination of these or multiple pulses or multiple maxima, depending upon the application.

Figure 5:
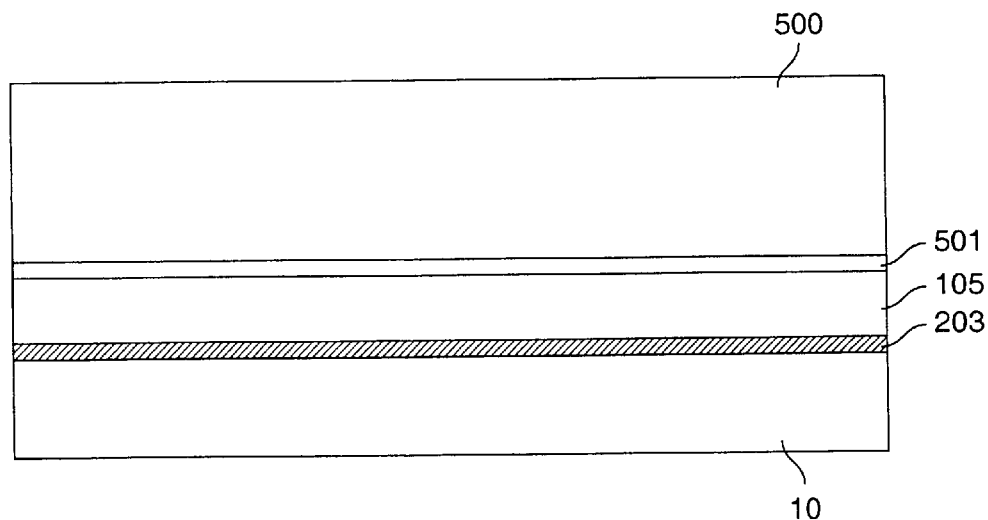

In preferred embodiments, the implanted substrate is bonded to a handle wafer 500, such as the one in FIG. 5. The implanted substrate or stressed substrate bonds through an interface 501, which can be almost any type of adhesive layer. The adhesive layer can include silicon dioxide, for example, as well as many other suitable materials. This silicon dioxide layer could have also been grown or deposited onto the donor wafer in an earlier step in combination with the implant step. This bonded multilayered structure is then subjected to the cleaving process, which is described below.

Figure 6C:
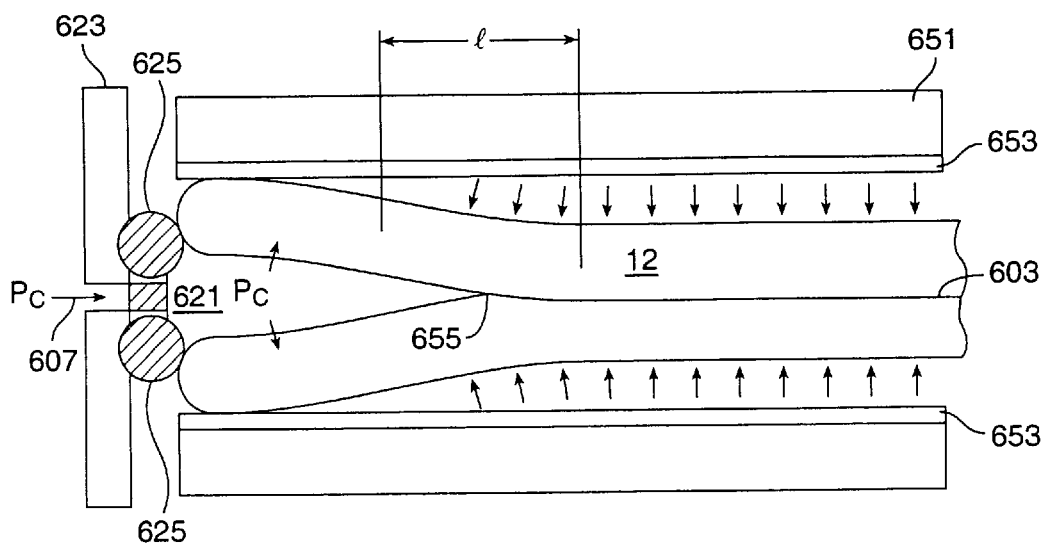
Figure 6:
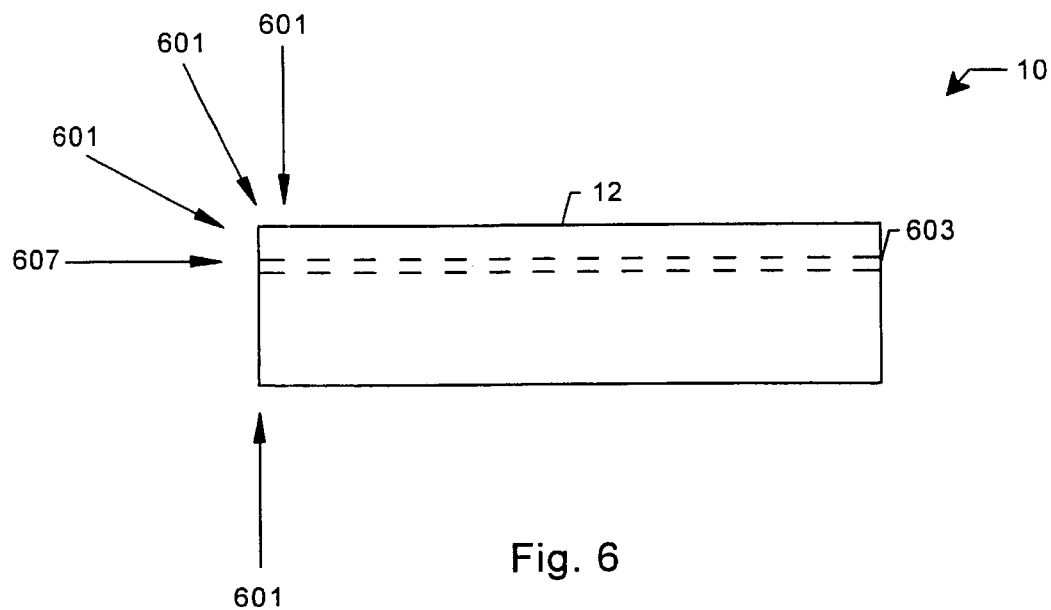

FIG. 6 is a simplified cross-sectional view of a stressed (e.g., implanted, layered) substrate 10 using selective positioning of cleave energy according to the present invention. This diagram is merely an illustration, and should not limit the scope of the claims herein. The wafer undergoes a step of selective energy placement 601 or positioning or targeting which provides a controlled cleaving action of the material region 12 at the selected depth 603. In preferred embodiments, selected energy placement 607 occurs near an edge or corner region of the selected depth 603 of substrate 10. The impulse (or impulses) is provided using energy sources. Examples of sources include, among others, a chemical source, a mechanical source, an electrical source, and a thermal sink or source. The chemical source can include a variety such as particles, fluids, gases, or liquids. These chemical sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid source, a liquid source, a gas source, an electro/magnetic field, an electron beam, a thermoelectric heating, a furnace, and the like. The thermal sink can be selected from a fluid source, a liquid source, a gas source, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. Preferably, the cleaving is initiated using a mechanical member applied to a region near or on the stressed region to initiate the cleaving action.

Figure 6A:
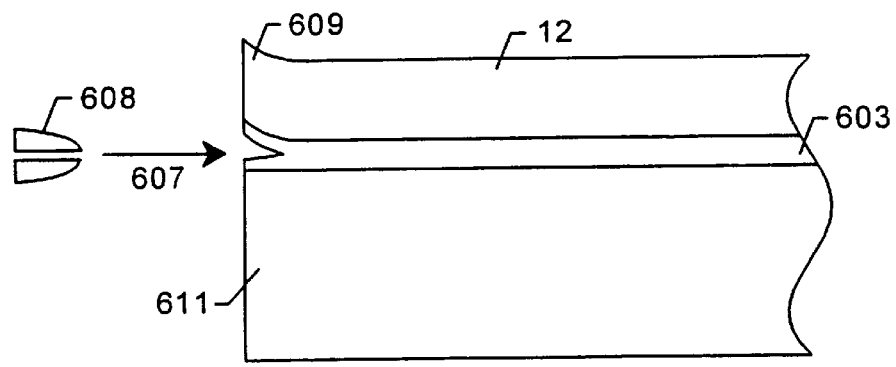

In a specific embodiment, the energy source can be a fluid source that is pressurized (e.g., compressional) according to an embodiment of the present invention. FIG. 6A shows a simplified cross-sectional view diagram of a fluid source from a fluid nozzle 608 used to perform the controlled cleaving process according to an embodiment of the present invention. The fluid source 607 (or liquid source or gas source) impinges and biases on an edge region of substrate 10 to initiate the controlled cleaving process. The fluid source from a compressed or pressurized fluid source is directed to a region at the selected depth 603 to cleave a thickness of material region 12 from substrate 10 using force, e.g., , hydrostatic, mechanical, chemical, thermal. As shown, the fluid source applies a bias to the substrate, which separates substrate 10 into two regions, including region 609 and region 611 that separate from each other at selected depth 603. The fluid source can also be adjusted to initiate and maintain the controlled cleaving process to separate material 12 from substrate 10. Depending upon the application, the fluid source can be adjusted in direction, location, and magnitude to achieve the desired controlled cleaving process. The fluid source can be a liquid jet or a gas jet or a combination of liquid and gas.

Figure 6B:
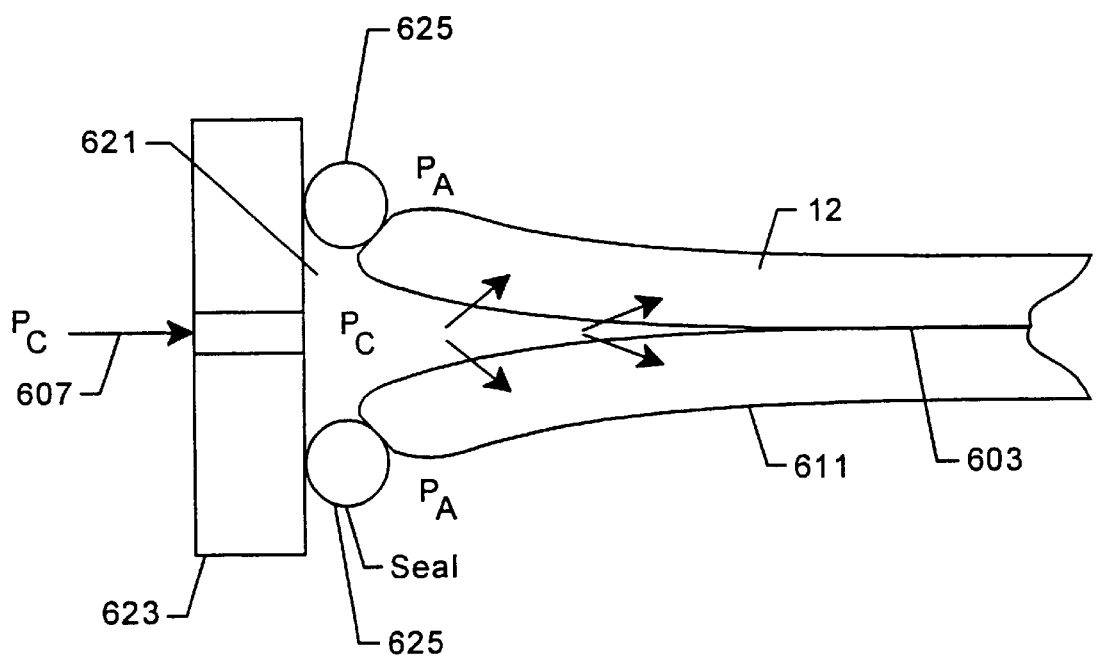

In a preferred embodiment, the energy source can be a compressional source such as, for example, compressed fluid that is static. FIG. 6B shows a simplified cross-sectional view diagram of a compressed fluid source 607 according to an embodiment of the present invention. The compressed fluid source 607 (e.g., pressurized liquid, pressurized gas) is applied to a sealed chamber 621, which surrounds a periphery or edge of the substrate 10. As shown, the chamber is enclosed by device 623, which is sealed by, for example, o-rings 625 or the like, and which surrounds the outer edge of the substrate. The chamber has a pressure maintained at $P_C$ that is applied to the edge region of substrate 10 to initiate the controlled cleaving process at the selected depth of stressed material. The outer surface or face of the substrate is maintained at pressure $P_A$ which can be ambient pressure e.g., 1atmosphere or less. A pressure differential exists between the pressure in the chamber, which is higher, and the ambient pressure. The pressure difference applies force to the stressed region at the selected depth 603. The stressed region at the selected depth can be structurally weaker than surrounding regions, including any bonded regions. Force is applied via the pressure differential until the controlled cleaving process is initiated. The controlled cleaving process separates the thickness of material 609 from substrate material 611 to split the thickness of material from the substrate material at the selected depth. Additionally, pressure $P_C$ forces material region 12 to separate by a "prying action" from substrate material 611. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas.

Preferably, the cleaving process occurs in a cleaving chamber, such as the one in a simplified diagram of FIG. 6C. The cleaving chamber includes two members 651, which supports on the outer faces of the substrate. The compressed fluid source 607 (e.g., pressurized liquid, pressurized gas) is applied to a sealed chamber 621, which surrounds a periphery or edge of the substrate. As shown, the chamber is enclosed by device 623, which is sealed by, for example, o-rings 625 or the like, and which surrounds the outer edge of the substrate. The chamber has a pressure maintained at $P_C$ that is applied to the edge region of substrate to initiate the controlled cleaving process at the selected depth of stressed material. The outer surface or face of the substrate is maintained at pressure $P_A$ which can be ambient pressure e.g., 1 atmosphere or less. A pressure differential exists between the pressure in the chamber, which is higher, and the ambient pressure. The pressure difference applies force to the stressed region at the selected depth 603. The stressed region at the selected depth can be structurally weaker than surrounding regions, including any bonded regions. Force is applied via the pressure differential until the controlled cleaving process is initiated. The controlled cleaving process separates the thickness of material 609 from substrate material 611 to split the thickness of material from the substrate material at the selected depth. Additionally, pressure $P_C$ forces material region 12 to separate by a "prying action" from substrate material 611. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas. The two members are generally at a fixed distance from each other. This fixed distance allows a relatively constant force or moment at region 655. Here, the prying action is governed by a distance (1), which is shown. This distance does not change and therefore provides for a substantially constant force at region 655. If the distance (1) is not constant, the force at region 655 can vary with constant pressure $P_C$, which provides a varying force or perhaps an uncontrolled cleaving process. Accordingly, the present method achieves a controlled cleaving action to form more uniform films and the like.

Optionally, the present cleaving technique uses a cleave initiation technique. In some embodiments, the present cleaving technique initiates at a physical region where the fluid source is directed. Alternatively, the present cleaving technique initiates using a chemical etchant or the like, which is applied to a region where the fluid source is to be directed. Such chemical etchant selectively weakens this region to help initiate the cleaving action. Alternatively, a mechanical member is used to physically initiate the cleaving action either directly or through a pre-indented Fracture region. The mechanical member can cause a blunt indent in the selected material region to cause a Hertzian cone crack. Still further, an implanting method can be used to localize a weak region, which will initiate the cleaving action. Moreover, a thermal means such as a laser source can be used. Other techniques can also be used to initiate the cleaving action.

Figure 7:
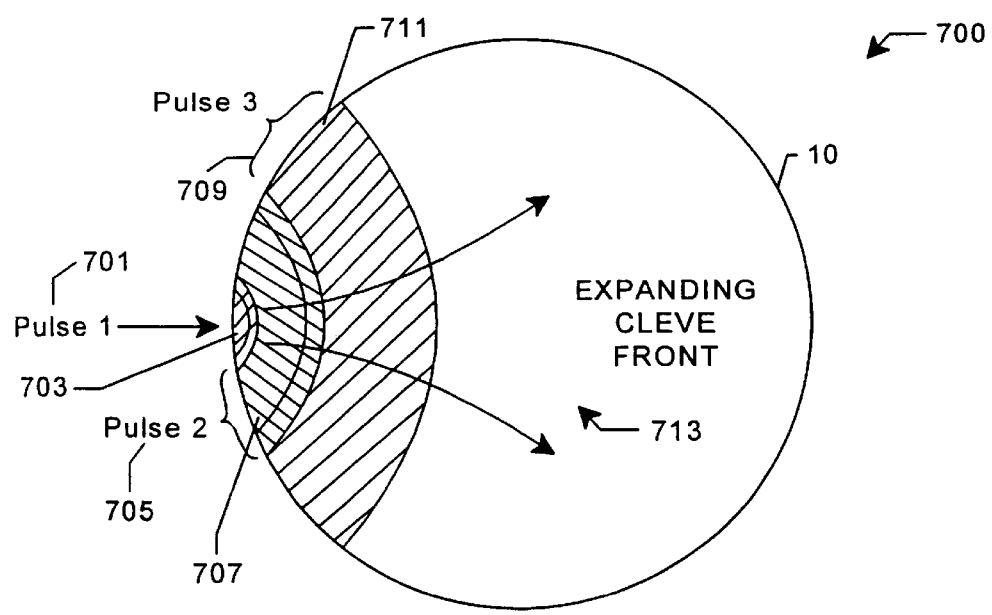

In a specific embodiment, the present invention provides a controlledpropagating cleave. The controlled-propagating cleave uses multiple successive impulses to initiate and perhaps propagate a cleaving process 700, as illustrated by FIG. 7. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 701 is directed to an edge 703 of the substrate to initiate the cleave action. Pulse 2 705 is also directed at the edge 707 on one side of pulse 1 to expand the cleave front. Pulse 3 709 is directed to an opposite edge 711 of pulse 1 along the expanding cleave front to further remove the material layer from the substrate. The combination of these impulses or pulses provides a controlled cleaving action 713 of the material layer from the substrate. In other embodiments, the present invention can use a static fluid or pressure source, rather than a pulse, to initiate and/or propagate the cleaving action.

Figure 8:
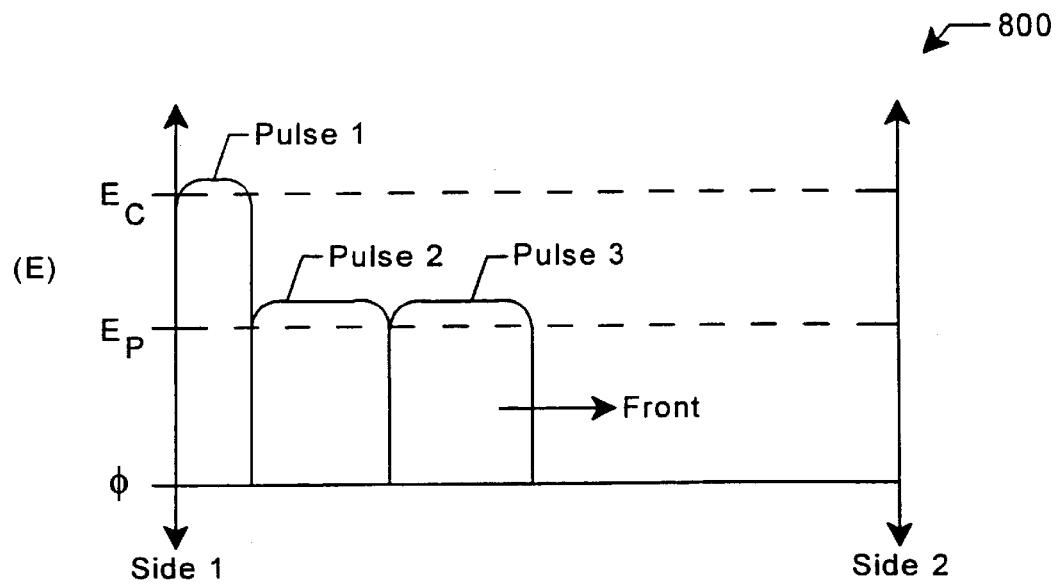

FIG. 8 is a simplified illustration of selected energies 800 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceed cleave energy formation or propagation energies. More preferably, the impinging beam cools and causes a thermal pulse gradient simultaneously, which exceed cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also chemude chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid source, a liquid source, a gas source, an electro/magnetic field, an electron beam, a thermoelectric heating, and a furnace. The thermal sink can be selected from a fluid source, a liquid source, a gas source, a cryogenic fluid, a supercooled liquid, a thermoelectric cooling means, an electro/magnetic field, and others.

Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the stressed region of the substrate until the thin film of material is removed. A variety of techniques can be used to initiate the cleave action. These techniques are described by way of the Figs. below.

Figure 9:
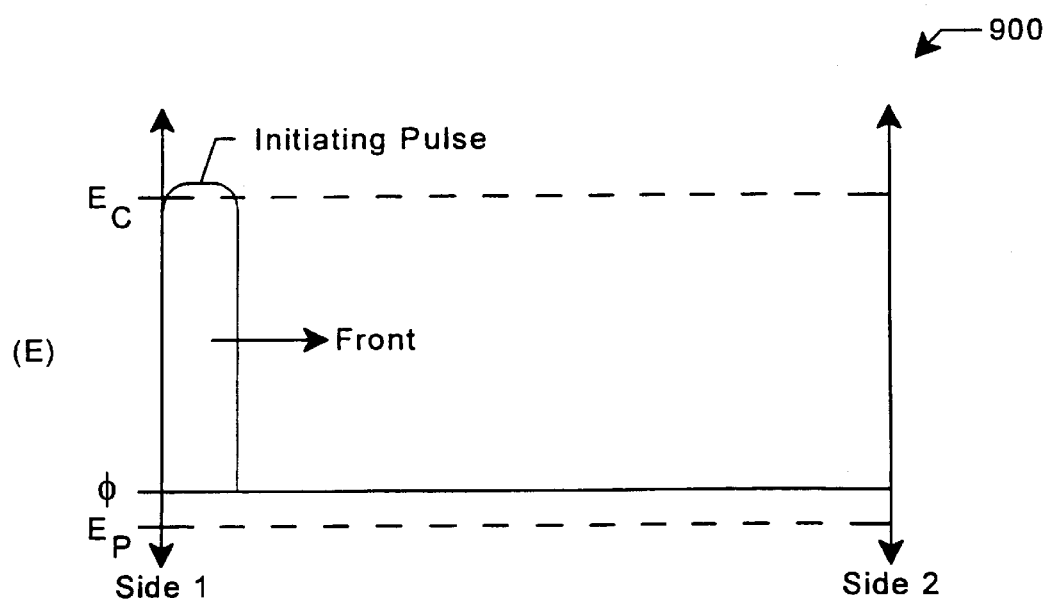

FIG. 9 is a simplified illustration of an energy state 900 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 10:
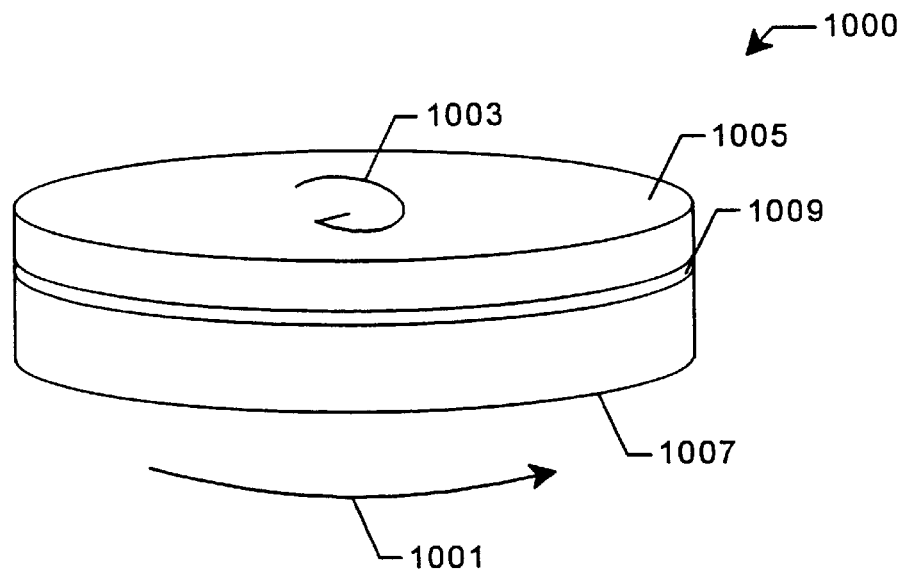
Figure 11:
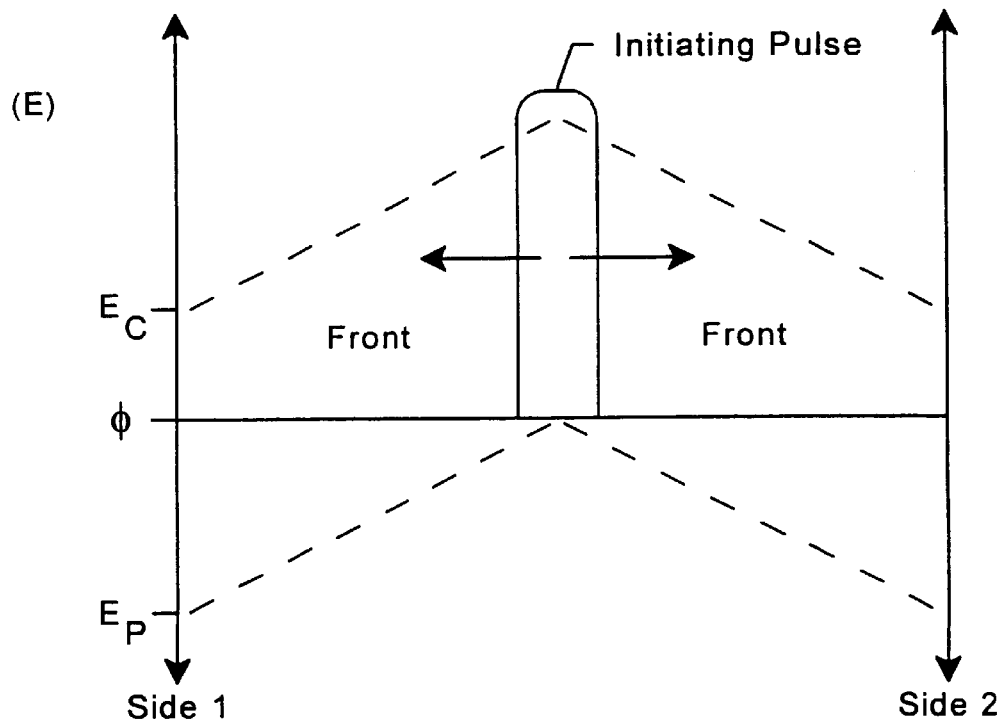

An alternative aspect of the invention is illustrated by FIGS. 10 and 11. FIG. 10 is a simplified illustration of a stressed substrate 1000 undergoing rotational forces 1001, 1003. This diagram is merely an illustration, and should not limit the scope of the claims herein. As shown, the substrate includes a top surface 1005, a bottom surface 1007, and an stressed region 1009 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 1001 on top surface and a rotational force turning counter-clockwise 1003 on the bottom surface which creates stress at the stressed region 1009 to initiate a cleave front. Alternatively, the top surface undergoes a counter-clockwise rotational force and the bottom surface undergoes a clockwise rotational force. Of course, the direction of the force generally does not matter in this embodiment.

FIG. 11 is a simplified diagram of an energy state 1100 for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the stressed region initiates the cleave front. In particular, rotational force applied to the stressed region of the substrates creates zero stress at the center of the substrate and greatest at the periphery, essentially being proportional to the radius. In this example, the central initiating pulse causes a radially expanding cleave front to cleave the substrate.

The removed material region provides a thin film of silicon material for processing. The silicon material possesses limited surface roughness and desired planarity characteristics for use in a silicon-on-insulator substrate. In certain embodiments, the surface roughness of the detached film has features that are less than about 60 nm, or less than about 40 nm, or less than about 20 nm. Accordingly, the present invention provides thin silicon films which can be smoother and more uniform than pre-existing techniques.

In a preferred embodiment, the present invention is practiced at temperatures that are lower than those used by pre-existing techniques. In particular, the present invention does not require increasing the entire substrate temperature to initiate and sustain the cleaving action as pre-existing techniques. In some embodiments for silicon wafers and hydrogen implants, substrate temperature does not exceed about 400° C. during the cleaving process. Alternatively, substrate temperature does not exceed about 350° C. during the cleaving process. Alternatively, substrate temperature is kept substantially below implanting temperatures via a thermal sink, e.g., cooling fluid, cryogenic fluid. Accordingly, the present invention reduces a possibility of unnecessary damage from an excessive release of energy from random cleave fronts, which generally improves surface quality of a detached film(s) and/or the substrate(s). Accordingly, the present invention provides resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electrostatics, adhesives, interatomic. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electrostatics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

A process for fabricating a silicon-on-insulator substrate according to the present invention may be briefly outlined as follows:

(1) Provide a donor silicon wafer (which may be coated with a dielectric material at any time between steps 1–4);
(2) Form stressed region in the donor silicon wafer at a selected depth to define a thickness of silicon film;
(3) Form device layer or material layer overlying the stressed layer (optional);
(4) Introduce particles into the stressed region;
(5) Provide a target substrate material (which may be coated with a dielectric material);
(6) Bond the donor silicon wafer to the target substrate material by joining the face to the target substrate material;
(7) Increase global stress (or energy) of stressed region at selected depth without initiating a cleaving action (optional);
(8) Provide stress (or energy) using a fluid source to a selected region of the bonded substrates to initiate a controlled cleaving action at the selected depth;
(9) Provide additional energy to the bonded substrates to sustain the controlled cleaving action to free the thickness of silicon film from the silicon wafer (optional);
(10) Complete bonding of donor silicon wafer to the target substrate; and
(11) Polish and/or smooth a surface of the thickness of silicon film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps are described in U.S. application Ser. No. 09/126,115, filed Feb. 19, 1998. (Attorney Docket No. 18419-000,150), which has been incorporated by reference herein.

Although the above description is in terms of a silicon wafer, other substrates may also be used. For example, the substrate can be almost any monocrystalline (e.g. epitaxial silicon wafer), polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A process for forming a film of material from substrates, said process comprising:

forming a stressed region at a selected depth underneath a surface of a substrate, said stressed region at said selected depth to define a substrate material to be removed above said selected depth, the stressed region comprising a deposited layer and an implanted region; and providing energy using a static pressure to a selected region of said substrate to initiate a controlled cleaving action at a cleaving plane within the deposited layer in said substrate, whereupon said cleaving action is made using a propagating cleave front to free a portion of said material to be removed from said substrate.

2. The process of claim 1 wherein said deposited layer comprises silicon germanium.

3. The process of claim 1 wherein the deposited layer comprises an epitaxial layer.

4. The process of claim 1 wherein said stressed region is derived from layer formed by physical vapor deposition or chemical vapor deposition.

5. The process of claim 1 wherein said providing energy sustains said controlled cleaving action to remove said material from said substrate to provide a film of material.

6. The process of claim 1 wherein said providing energy increases a controlled stress in said material and sustains said controlled cleaving action to remove said material from said substrate to provide a film of material.

7. The process of claim 1 further comprising providing additional energy to said substrate to sustain said controlled cleaving action to remove said material from said substrate to provide a film of material.

8. The process of claim 1 further comprising providing additional energy to said substrate to increases a controlled stress in said material and sustains said controlled cleaving action to remove said material from said substrate to provide a film of material.

9. The process of claim 1 wherein said substrate is a silicon or epitaxial silicon wafer.

10. The process of claim 1 wherein the implanted region comprises hydrogen bearing particles.

11. The process of claim 1 wherein said propagating cleave front is selected from a single cleave front or multiple cleave fronts.

12. The process of claim 1 wherein said stressed layer is provided by a presence of deuterium particles at said selected depth.

13. The process of claim 1 wherein said substrate is made of a material selected from the group consisting of silicon, diamond, quartz, glass, sapphire, silicon carbide, dielectric, group III/V material, plastic, ceramic material, and multi-layered substrate.

14. The process of claim 1 wherein said surface is planar.

15. The process of claim 1 wherein said surface is curved.

16. The process of claim 1 wherein said substrate is a silicon substrate comprising an overlying layer of dielectric material, said selected depth being underneath said dielectric material.

17. The process of claim 1 wherein said fluid is selected from a static source or a fluid jet source.

18. The process of claim 1 wherein said fluid is directed to said selected depth to initiate said controlled cleaving action.

19. The process of claim 1 wherein said fluid is derived from a compressed gas.

20. A process for forming substrates, said process comprising:

forming a stressed region at a selected depth underneath a surface of a substrate, said stressed region at said selected depth to define a substrate material to be removed above said selected depth, said stressed region comprising at least a deposited layer and an implanted region;

bonding said surface of the substrate to a handle substrate; and providing energy using a static fluid source to a selected region of said substrate to initiate a controlled cleaving action at a cleaving plane at said selected depth in said substrate, whereupon said cleaving action is made using a propagating cleave front to free a portion of said material to be removed from said substrate.

* * * * *

UNITED STATES PATENT AND TRADEMARK OFFICE
CERTIFICATE OF CORRECTION

PATENT NO. : 6,033,974  
DATED : March 7, 2000  
INVENTOR(S) : Henley, et al.

Page 1 of 7

It is certified that error appears in the above-identified patent and that said Letters Patent is hereby corrected as shown below:

Item [56] References Cited , please add the following references:

U.S. PATENT DOCUMENTS

| Number | Date | Name | Class |
|---|---|---|---|
| 2614055 | 10/1952 | Seanarelens | |
| 3117022 | 1/1964 | Bronson et al. | 117/212 |
| 3225820 | 12/1965 | Riordan | 165/26 |
| 3551213 | 12/1970 | Boyle | 148/1 |
| 3786359 | 1/1974 | King | 328/233 |
| 3806380 | 4/1974 | Kitada et al. | 148/159 |
| 3832219 | 8/1974 | Nelson et al. | 117/93 |
| 3900636 | 8/1975 | Curry et al. | 427/38 |
| 3915757 | 10/1975 | Engel | 148/6 |
| 3957107 | 5/1976 | Altoz et al. | 165/32 |
| 3993909 | 11/1976 | Drews et al. | 250/492 |
| 4006340 | 2/1977 | Gorinas | 219/121 |
| 4039416 | 8/1977 | White | 204/192 |
| 4074139 | 2/1978 | Pankove | 250/492 |
| 4107350 | 8/1978 | Berg et al. | 427/38 |
| 4108751 | 8/1978 | King | 204/192 |
| 4121334 | 10/1978 | Wallis | 29/589 |
| 4170662 | 10/1979 | Weiss et al. | 427/38 |
| 4252837 | 2/1981 | Auton | 427/39 |
| 4274004 | 6/1981 | Kanai | 250/442 |
| 4342631 | 8/1982 | White et al. | 204/192 |
| 4346123 | 8/1982 | Kaufmann | 427/38 |
| 4952273 | 8/1990 | Popov | 156/643 |
| 4361600 | 11/1982 | Brown | 427/93 |
| 4368083 | 1/1983 | Bruel et al. | 148/1 |
| 4412868 | 11/1983 | Brown et al. | 148/1 |
| 4452644 | 6/1984 | Bruel et al. | 148/1 |
| 4468309 | 8/1984 | White | 204/192 |
| 4471003 | 9/1984 | Cann | 427/34 |
| 4486247 | 12/1984 | Ecer et al. | 148/31 |
| 4490190 | 12/1984 | Speri | 148/16 |
| 4500563 | 2/1985 | Ellenberger et al. | 427/38 |
| 4508056 | 4/1985 | Bruel et al. | 118/730 |
| 4536657 | 8/1985 | Bruel | 250/492 |
| 4566403 | 1/1986 | Fournier | 118/718 |

UNITED STATES PATENT AND TRADEMARK OFFICE
CERTIFICATE OF CORRECTION

PATENT NO.   : 6,033,974
DATED        : March 7, 2000
INVENTOR(S)  : Henley, et al.

It is certified that error appears in the above-identified patent and that said Letters Patent is hereby corrected as shown below:

| | | | |
|---|---|---|---|
| 4567505 | 1/1986 | Pease | 357/81 |
| 4568563 | 2/1986 | Jackson et al. | 427/40 |
| 4585945 | 4/1986 | Bruel et al. | 250/492 |
| 4684535 | 8/1987 | Heinecke et al. | 427/38 |
| 4704302 | 11/1987 | Bruel et al. | 427/38 |
| 4717683 | 1/1988 | Parrillo et al. | 437/34 |
| 4764394 | 8/1988 | Conrad | 427/38 |
| 4837172 | 6/1989 | Mizuno et al. | 437/11 |
| 4846928 | 7/1989 | Dolins et al. | 156/626 |
| 4847792 | 7/1989 | Barna et al. | 364/552 |
| 4853250 | 8/1989 | Boulos et al. | 427/34 |
| 4887005 | 12/1989 | Rough et al. | 315/111 |
| 4894709 | 1/1990 | Phillips et al. | 357/82 |
| 4931405 | 6/1990 | Kamijo et al. | 437/12 |
| 4948458 | 8/1990 | Ogle | 156/643 |
| 4960073 | 10/1990 | Suzuki et al. | 118/723 |
| 4982090 | 1/1991 | Wittmaack | 250/309 |
| 4996077 | 2/1991 | Moslehi et al. | 427/38 |
| 5015353 | 5/1991 | Hubler et al. | 204/192 |
| 5034343 | 7/1991 | Rouse et al. | 437/86 |
| 5070040 | 12/1991 | Pankove | 437/209 |
| 5082793 | 1/1992 | Li | 437/26 |
| 5110748 | 5/1992 | Sarma | 437/51 |
| 5133826 | 7/1992 | Dandl | 156/345 |
| 5196355 | 3/1993 | Wittkower | 437/24 |
| 5198371 | 3/1993 | Li | 437/24 |
| 5202095 | 04/1993 | Houchin et al. | 422/186 |
| 5203960 | 4/1993 | Dandl | 156/643 |
| 5234529 | 8/1993 | Johnson | 156/345 |
| 5242861 | 9/1993 | Inaba | 437/170 |
| 5250328 | 10/1993 | Otto | 427/535 |
| 5252178 | 10/1993 | Moslehi | 156/643 |
| 5269880 | 12/1993 | Jolly et al. | 156/643 |
| 5273610 | 12/1993 | Thomas, III et al. | 156/345 |
| 5304509 | 4/1994 | Sopori | 437/173 |
| 5342472 | 8/1994 | Imahashi et al. | 156/345 |
| 5363603 | 11/1994 | Miller et al. | |
| 5368710 | 11/1994 | Chen et al. | 204/192 |

UNITED STATES PATENT AND TRADEMARK OFFICE
CERTIFICATE OF CORRECTION

PATENT NO. : 6,033,974
DATED : March 7, 2000
INVENTOR(S) : Henley, et al.

It is certified that error appears in the above-identified patent and that said Letters Patent is hereby corrected as shown below:

| | | | |
|---|---|---|---|
| 5370765 | 12/1994 | Dandl | 156/643 |
| 5374564 | 12/1994 | Bruel | 438/455 |
| 5376560 | 12/1994 | Aronowitz et al. | 437/24 |
| 5404079 | 4/1995 | Ohkuni et al. | 315/111 |
| 5405480 | 4/1995 | Benzing et al. | 156/345 |
| 5411592 | 5/1995 | Ovshinsky et al. | 118/718 |
| 5435880 | 7/1995 | Minato et al. | 156/345 |
| 5487785 | 1/1996 | Horiike et al. | 118/723 |
| 5494835 | 2/1996 | Bruel | 437/24 |
| 5504328 | 4/1996 | Bonser | 250/288 |
| 5559043 | 9/1996 | Bruel | 437/24 |
| 5653811 | 8/1997 | Chan | 118/723 |
| 5869387 | 2/1999 | Sato et al. | |
| 5877070 | 3/1999 | Gosele et al. | |
| 5966620 | 10/1999 | Sakaguchi et al. | |
| 4116751 | 9/1978 | Zaromb | |
| 4883561 | 11/1989 | Gmitter et al. | |
| 5234535 | 8/1993 | Beyer et al. | |
| 5354381 | 10/1994 | Sheng | |
| 5476691 | 12/1995 | Komvopoulos et al. | |
| 5558718 | 9/1996 | Leung | |
| 5710057 | 1/1998 | Kenney | |

FOREIGN PATENT DOCUMENTS

| | | |
|---|---|---|
| 0084287 | 7/1983 | EP |
| 0099778 | 2/1984 | EP |
| 0155875 | 2/1984 | EP |
| 0112230 | 4/1987 | EP |
| 0112238 | 6/1984 | EP |
| 0164281 | 12/1985 | EP |
| 0181249 | 6/1989 | EP |
| 0504714 | 9/1992 | EP |
| 0533551 | 3/1993 | EP |
| 0355913 | 12/1993 | EP |
| 0379828 | 9/1995 | EP |
| 0459177 | 12/1995 | EP |
| 0660140 | 6/1995 | EP |

UNITED STATES PATENT AND TRADEMARK OFFICE
CERTIFICATE OF CORRECTION

PATENT NO. : 6,033,974  
DATED : March 7, 2000  
INVENTOR(S) : Henley, et al.

It is certified that error appears in the above-identified patent and that said Letters Patent is hereby corrected as shown below:

| | | |
|---|---|---|
| 0665587 | 8/1995 | EP |
| 0665588 | 2/1995 | EP |
| 0703609 | 3/1996 | EP |
| 0763849 | 3/1997 | EP |
| 1558881 | 1/1969 | FR |
| 2235474 | 4/1974 | FR |
| 2261802 | 2/1974 | FR |
| 2266304 | 4/1975 | FR |
| 2298880 | 1/1975 | FR |
| 2519437 | 1/1982 | FR |
| 2529383 | 6/1982 | FR |
| 2537768 | 8/1982 | FR |
| 2537777 | 12/1982 | FR |
| 2560426 | 2/1984 | FR |
| 2563377 | 4/1984 | FR |
| 2575601 | 12/1984 | FR |
| 2681472 | 9/1991 | FR |
| 2714524 | 12/1993 | FR |
| 2715501 | 1/1994 | FR |
| 2715502 | 1/1994 | FR |
| 2715503 | 1/1994 | FR |
| 2720189 | 5/1994 | FR |
| 2725074 | 9/1994 | FR |
| 834363 | 3/1952 | Germany |
| 4-246594 | 9/1992 | JP |
| 4-76503 | 7/1990 | JP |
| 5-211128 | 8/1993 | JP |
| 7-215800 | 8/1995 | JP |
| 7-254690 | 10/1995 | JP |
| 7-263291 | 10/1995 | JP |
| 8-97389 | 4/1996 | JP |
| 53-104156 | 9/1978 | JP |
| 58-144475 | 08/1983 | JP |
| 59-19394 | 1/1984 | JP |
| 59-46750 | 3/1984 | JP |
| 59-54217A | 3/1984 | JP |
| 59-114744 | 7/1984 | JP |

UNITED STATES PATENT AND TRADEMARK OFFICE
CERTIFICATE OF CORRECTION

PATENT NO. : 6,033,974  
DATED : March 7, 2000  
INVENTOR(S) : Henley, et al.

Page 5 of 7

It is certified that error appears in the above-identified patent and that said Letters Patent is hereby corrected as shown below:

| | | |
|---|---|---|
| 59-139539 | 8/1984 | JP |
| 60-83591 | 10/1983 | JP |
| 60-207237 | 10/1985 | JP |
| 60-235434 | 11/1958 | JP |
| 2221991 | 7/1989 | GB |
| WO95/10718 | 4/1995 | WO |
| WO95/20824 | 8/1995 | WO |
| WO95/31825 | 11/1995 | WO |
| WO99/35674 | 7/1999 | WO |

OTHER REFERENCES

Alles, Michael et al., "Thin Film Silicon on Insulator: An Enabling Technology," Semiconductor International, pp. 67-72, 1997

Basta, Nicholas, "Ion-Beam Implantation," High Technology, 1985

Burggraff, Peter, "Advanced Plasma Source: What's Working?" Semiconductor International, pp. 56-59, May 1994

Cassidy, Victor M., "Ion Implanation Process Toughens Metalworking Tools," Modern Metals, pp. 65-67, 1984

Cheung, N.W., "Plasma Immersion Ion Implantation for Semiconductor Processing," Material Chemistry and Physics, vol. 46/2-3, pp. 132-139 (1996)

Chu, P.K. et al., Plasma Immersion Ion Implanation-A Fledgling Technique for Semiconductor Processing, Materials Science and Engineering Reports: A Review Journal, pp. 207-280, vol. R17, Nos. 6-7, Nov. 30, 1996

Chu, Paul K. et al., "Recent Applications of Plasma Immersion Ion Implantation," Semiconductor International, pp. 165-172, 1996

Chu, Paul K., "Synthesis of SOI Materials Using Plasma Immersion Ion Implantation," Mat. Res. Soc. Symp. Proc. Vol. 438 1997 Materials Research Society, pp. 333-343, 1997

UNITED STATES PATENT AND TRADEMARK OFFICE
CERTIFICATE OF CORRECTION

PATENT NO. : 6,033,974
DATED : March 7, 2000
INVENTOR(S) : Henley, et al.

It is certified that error appears in the above-identified patent and that said Letters Patent is hereby corrected as shown below:

Carter, G. et al. "The Collection of Ions Implanted in Semiconductors Radiation Effects." Sep. 1972, vol. 16, No. 1-2, pp. 107-114. Abstract Only.

Hulett, D.M. et al., "Ion Nitriding and Ion Implanation: A Comparison," Metal Progress, pp. 18-21, 1985

I.B.M. Technical Disclosure Bulletinm, vol. 29, No. 3, p. 1416, Aug. 1986

Lee, B.H. et al., "A Novel Pattern Transfer Process for Bonded SOI Giga-bit DRAMSs," 1996 IEEE Int'l. SOI Conference Proceedings, IEEE Electron Devices Society, pp. 1996

Li, J., "Novel Semiconductor Substrate Formed by Hydrogen Ion Implantation into Silicon," Appl. Phys. Lett., vol. 55, No. 21, pp. 2223-2224, Nov. 20, 1989

Lu, X. et al., "SOI Material Technology Using Plasma Immersion Ion Implantation," Proceedings 1996 IEEE International SOI Conferece (Oct. 1996)

Matsuda et al., "Large Diameter Ion Beam Implanation System," Nuclear Instruments and Methods, vol. B21, pp. 314-316, 1987

Moreau, Wayne M., "Semiconductor Lithography, Principles, Practices, and Materials," Plenum Press, 1988. Table of Contents only.

Patent Abstracts of Japan, vol. 7, No. 107 (E-174), May 11, 1993, JP-58-030145 A, Feb. 22, 1983

Picraux, S. Thomas et al., "Ion Implanationof Surfaces," Scientific American, vol. 252, No. 3., pp. 102-113, 1985

Renier, M. et al., "A New Low-Energy Ion Implanter for Bombardment of Cylindrical Surfaces," Vacuum, vol. 35, No. 12, pp. 577-578, 1985

Sioshansi, Piran, "Ion Beam Modification of Materials for Industry," Thin Solid Film, vol. 118, pp. 61-71, 1984

UNITED STATES PATENT AND TRADEMARK OFFICE
CERTIFICATE OF CORRECTION

PATENT NO. : 6,033,974
DATED : March 7, 2000
INVENTOR(S) : Henley, et al.

It is certified that error appears in the above-identified patent and that said Letters Patent is hereby corrected as shown below:

Wolf, Stanley Ph.D., Silicon Processing for the VLSI Era (vol. 2), pp. 66-79 (1990)

U.S. Dept. of Energy, "The Fusion Connection: . . . ", Plasma Coating, pp. 6-7, 1985

Veldkamp, W.B. et al., "Binary Optics," Scientific American, pp. 50-55, May 1992

Signed and Sealed this

Twenty-seventh day of November, 2001

Attest:

*Nicholas P. Godici*

*Attesting Officer*

NICHOLAS P. GODICI
*Acting Director of the United States Patent and Trademark Office*